United States Patent [19]

Furuyama

[11] Patent Number: 5,553,024
[45] Date of Patent: Sep. 3, 1996

[54] SEMICONDUCTOR MEMORY UTILIZING RAS AND CAS SIGNALS TO CONTROL THE LATCHING OF FIRST AND SECOND READ OR WRITE DATA

[75] Inventor: Tohru Furuyama, Tokyo, Japan

[73] Assignee: Kabushiki Kaisha Toshiba, Kawasaki, Japan

[21] Appl. No.: 419,769

[22] Filed: Apr. 10, 1995

Related U.S. Application Data

[63] Continuation of Ser. No. 203,594, Feb. 28, 1994, abandoned, which is a continuation of Ser. No. 835,119, Feb. 14, 1992, abandoned, which is a continuation of Ser. No. 541,024, Jun. 20, 1990, abandoned.

[30] Foreign Application Priority Data

Jun. 21, 1989 [JP] Japan .................... 1-156677

[51] Int. Cl.$^6$ .................... G11C 11/407; G11C 7/00
[52] U.S. Cl. .................... 365/189.05; 365/193; 365/233
[58] Field of Search .................... 365/189.05, 193, 365/233

[56] References Cited

U.S. PATENT DOCUMENTS

| | | | |
|---|---|---|---|
| 4,322,825 | 3/1982 | Nagami .................... | 365/233 |
| 4,415,994 | 11/1983 | Ive et al. .................... | 365/189.05 |
| 4,685,088 | 8/1987 | Iannucci .................... | 365/189.05 |
| 4,707,809 | 11/1987 | Ando .................... | 365/189.05 |
| 4,716,550 | 12/1987 | Flannagan et al. .................... | 365/189.05 |
| 4,766,572 | 8/1988 | Kobayashi .................... | 365/189.05 |
| 4,831,597 | 5/1989 | Fuse .................... | 365/208 |
| 4,908,796 | 3/1990 | Lee et al. .................... | 365/189.05 |
| 4,928,265 | 5/1990 | Higuchi et al. .................... | 365/189.05 |
| 5,065,365 | 11/1991 | Hirayama .................... | 365/189.05 |
| 5,179,687 | 1/1993 | Hidaka et al. .................... | 365/193 |

FOREIGN PATENT DOCUMENTS

| | | |
|---|---|---|
| 53-78740 | 7/1978 | Japan . |
| 0005493 | 1/1986 | Japan .................... 365/233 |
| 61-148692 | 7/1986 | Japan . |
| 62-250584 | 10/1987 | Japan . |

Primary Examiner—Glenn Gossage
Attorney, Agent, or Firm—Banner & Allegretti, Ltd.

[57] ABSTRACT

An improved semiconductor memory device such as a dynamic random access memory (DRAM) includes a latch circuit and an output buffer. The latch circuit latches first data read out from one memory cell of a memory cell array during one cycle of a row address strobe (RAS) signal and during one cycle of a column address strobe (CAS) signal. During another cycle of the row address strobe signal and during another cycle of the column address strobe signal, the first data is transferred from the latch circuit to the output buffer and the latch circuit latches second data read out from another memory cell of the memory cell array. The use of the latch circuit and output buffer reduces access time and increases the data transfer rate of the memory device.

12 Claims, 15 Drawing Sheets

TIMING CHART SHOWING A FIRST OPERATION OF THE DEVICE SHOWN IN FIG. 8

TIMING CHART SHOWING A SECOND OPERATION OF THE DEVICE SHOWN IN FIG. 8

TIMING CHART SHOWING A THIRD OPERATION OF THE DEVICE SHOWN IN FIG. 8

SEMICONDUCTOR MEMORY UTILIZING RAS AND CAS SIGNALS TO CONTROL THE LATCHING OF FIRST AND SECOND READ OR WRITE DATA

This is a continuation of application Ser. No. 08/203,594, filed Feb. 28, 1994, now abandoned, which is a continuation of application Ser. No. 07/835,119, filed Feb. 14, 1992, now abandoned, which is a continuation of application Ser. No. 07/541,024, filed Jun. 20, 1990, also now abandoned.

BACKGROUND OF THE INVENTION

1. Field of the Invention

This invention relates to a semiconductor memory device such as a random access memory (RAM) and a read only memory (ROM).

2. Description of the Related Art

FIG. 1 is a block diagram showing the structure of a conventional memory device; for example, a one mega byte dynamic RAM (DRAM). The internal circuit operation of the DRAM is schematically represented by the timing charts of FIGS. 2 and 3.

In one cycle, a row address and a column address are retrieved by an internal circuit at a trailing edge of a $\overline{RAS}$ (Row Address Strobe) clock and at a trailing edge of a $\overline{CAS}$ (Column Address Strobe) clock, respectively. At the same time the column address is retrieved, it is determined whether the cycle is a writing cycle or a reading cycle, in accordance with the level "H" or "L" of the $\overline{WRITE}$ signal. Upon completion of a data-writing or data-reading, the $\overline{RAS}$ clock rises again, and the internal circuit is put into a stand-by state in which it is ready for a next operation.

The DRAM shown in FIG. 1 operates either in reading mode or writing mode under the control of three clock signals, $\overline{RAS}$, $\overline{CAS}$, and $\overline{WRITE}$. In the reading mode, it performs row selection, detection of data within a cell, column selection, data-outputting, and stand-by. All of these operations, except for standby, are performed by the DRAM during each RAS-cycle period, i.e., from the trailing edge of the $\overline{RAS}$ clock to the next trailing edge thereof. Obviously, the RAS-cycle period determines the number of data items which can be read from the DRAM per unit time, which is generally known as "data rate". To increase the data rate, the RAS-cycle period must be shortened by raising the operation speed of the DRAM. However, it is difficult to sufficiently increase the operation speed of the DRAM with the technology now available. In other words, the DRAMs now available can operate only at speeds far lower than that of CPUs (Central Processing Units).

To achieve a high data rate in DRAMs, various methods have been devised. One of them is to drive the circuits incorporated in a DRAM in page mode, as is shown in FIG. 4. Another of these methods is to drive the circuits in static column mode as is illustrated in FIG. 5. Still another of these methods is to drive the circuits in nibble mode as will be explained with reference to FIGS. 6 and 7.

In the page mode, one of the memory-cell rows of the DRAM is selected for a predetermined period during which the $\overline{RAS}$ clock is at a low level $V_{IL}$. Then, some of the memory-cell columns are selected by column select signals which are generated in response to successive CAS clock pulses. The column select signals are supplied to input/output gates from the column decoder, whereby data is read from those memory cells of the selected row which belong to the columns designated during the CAS clock pulses. In the page mode, once one memory-cell row is selected, it is no longer necessary to select the same row repeatedly in order to read data from the cells of this row. As a comparison of FIG. 4 with FIGS. 2 and 3 clearly indicates, the data rate achieved by driving the internal circuits in the page mode is higher than when the circuits are driven in the mode shown in FIGS. 2 and 3.

In the static column mode, one of the memory-cell rows of the DRAM is selected in accordance with the corresponding row address. While this row is in the selected state, some column select signals are supplied to the input/output gates from the column decoder, whereby data is read from those of the memory cells selected row which belong to the columns designated by the column select signal. In the static column mode, too, once one row is selected, it is no longer necessary to select the same row repeatedly in order to read data from the cells of this row. As a comparison of FIG. 5 with FIGS. 2 and 3 clearly indicates, the data rate achieved by driving the internal circuits in the static column mode is higher than when the circuits are driven in the mode shown in FIG. 2 or 3.

The nibble mode can be applied to a DRAM having the structure shown in FIG. 6. In the nibble mode, once one of the memory-cell rows and one of the memory-cell columns are selected in accordance with the corresponding row address and column address, 4-bit data are read consecutively, the first one of which is designated by the row and column addresses, without supplying the column address to select the cells, as is illustrated in FIG. 7. As may be understood from FIG. 7 in comparison with FIG. 5 with FIGS. 2 and 3, the data rate achieved by driving the internal circuits in the nibble mode is higher than when the circuits are driven in the mode shown in FIG. 2 or 3.

Further, a so-called dual port RAM is known, which has a serial register. Once one of the memory-cell rows and one of the memory-cell columns are selected in accordance with the corresponding row address and column address, data is consecutively read from a serial register, the first one of which is designated by the row and column addresses and the number of which is equal to or less than the digits of the serial register, without supplying the column address during each RAS-cycle period. Therefore, the data rate achieved in the dual port RAM is higher than when the circuits are driven in the mode shown in FIG. 2 or 3.

The first method of driving the internal circuits in the page mode, and the second method of driving the circuits in the static column mode, however, cannot achieve random access to the memory cell array; they achieve nothing other than pseudo-serial access. The third method of driving the circuits in the nibble mode is disadvantageous in that the memory cells selected are always consecutive 4 cells forming a group, not the cells which are selected at random; the freedom of choice is limited. The dual port RAM can indeed be accessed at high speed, but this high-speed accessing is serial, not random.

SUMMARY OF THE INVENTION

It is accordingly an object of the present invention to provide a semiconductor memory device in which the data rate can be higher than that of the cycle period required for accomplishing one reading or writing operation without increasing the operation speed of the RAM, and in which data to be read or written can be accessed perfectly at random.

To achieve the above object, according to a first aspect of the present invention, there is provided a semiconductor memory device comprising a semiconductor circuit having a memory cell array and an output buffer for outputting data read from the memory cell array. The semiconductor memory circuit performs a read or write operation by repeating a cycle from an edge (leading or trailing) of a clock signal to the next corresponding edge of the clock singal. Alternatively, this cycle can be repeated from one address change to the next. The semiconductor memory device further comprises a latch for latching first data read from the memory cell array during a first cycle and latching second data read from the memory cell array after transferring the first data to the output buffer during a second cycle.

According to a second aspect of the present invention, there is provided a semiconductor memory device comprising a semiconductor memory circuit having a memory cell array, an output buffer for outputting data read from the memory cell array, and an input buffer for writing data into the memory cell array. The semiconductor memory circuit performs a read or write operation by repeating a cycle from an edge (leading or trailing) of a clock signal to the next corresponding edge of the clock signal. Alternately, this cycle can be repeated from one address change to the next. The semiconductor memory device further comprises a latch for latching first data read from the memory cell array during a first cycle. During a second cycle, the first data is transferred to the output buffer and second data is written from the input buffer into the memory cell array.

According to a third aspect of the present invention, there is provided a semiconductor memory device comprising a semiconductor memory circuit having a memory cell array, an output buffer for outputting data read from the memory cell array, and an input buffer for writing data into the memory cell array. The semiconductor memory circuit performs a read or write operation by repeating a cycle from an edge (leading or trailing) of a clock signal to the next corresponding edge of the clock signal. Alternatively, this cycle can be repeated from one address change to the next. The semiconductor memory device further comprises a latch for latching first data read from the memory cell array during a first cycle. During a second cycle, the first data is not transferred to the output buffer but second data is written from the input buffer into the memory cell array.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
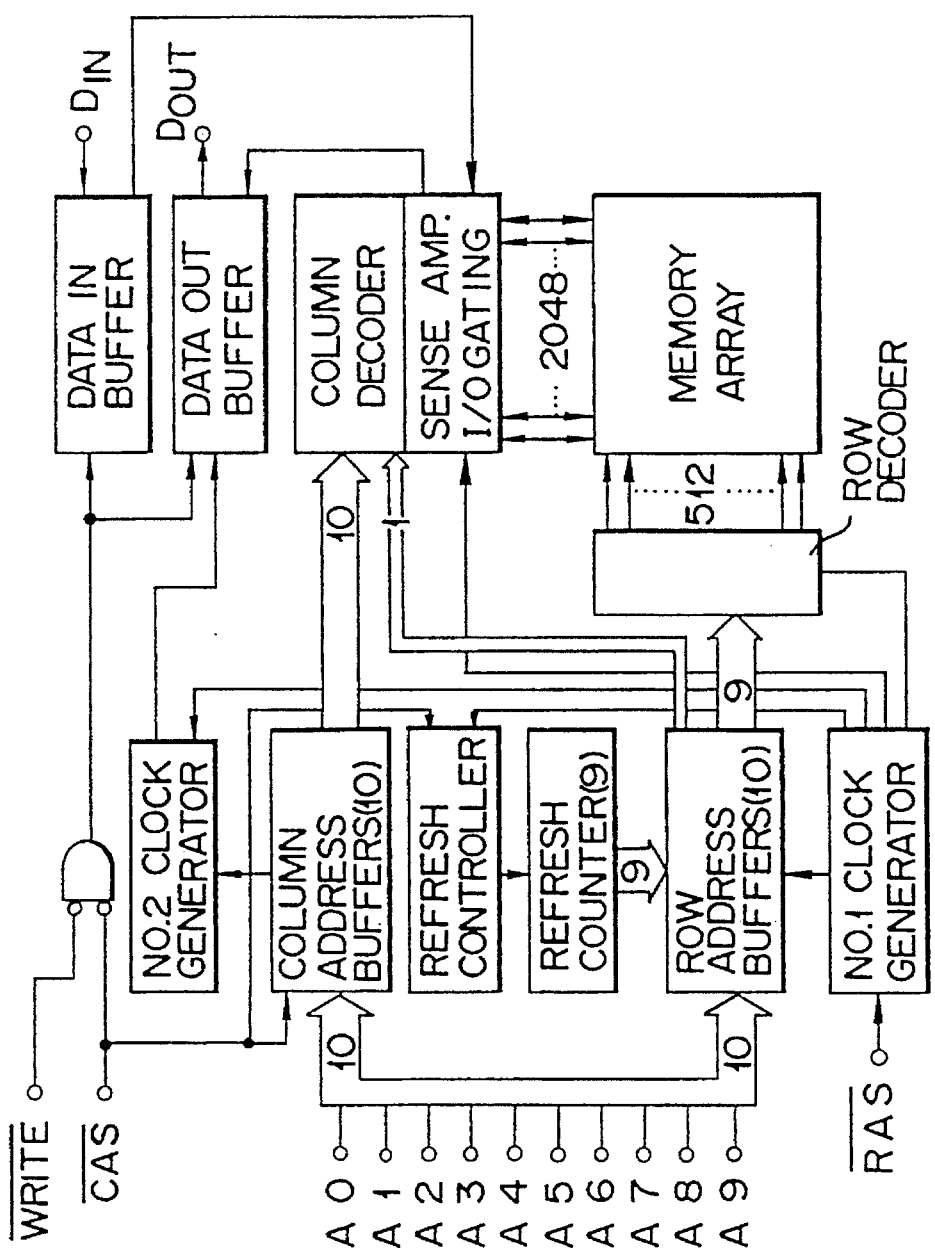
FIG. 1 is a block diagram showing the structure of a conventional semiconductor memory device.
Figure 2:
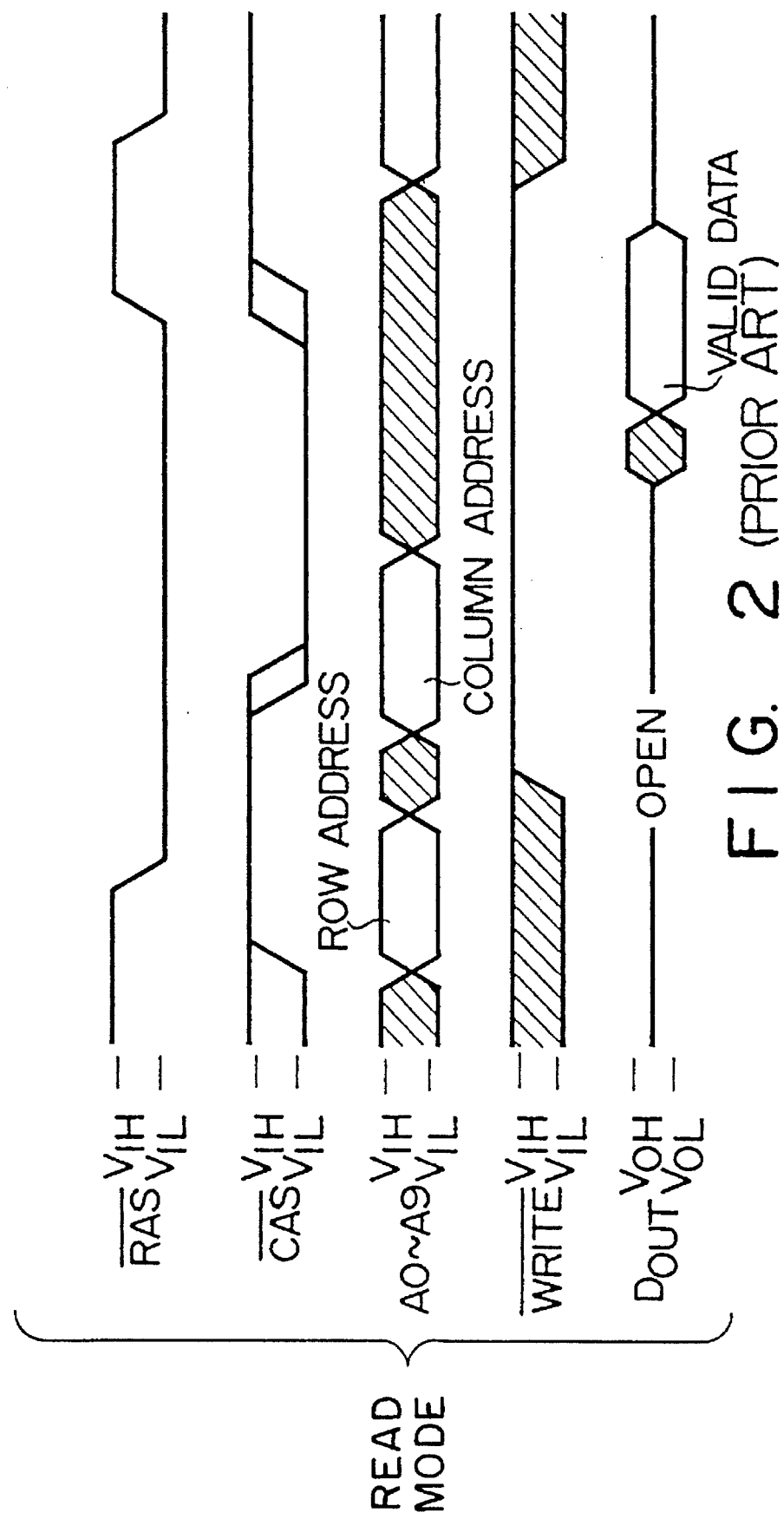
FIGS. 2 and 3 are timing charts showing the operation of the device shown in FIG. 1.
Figure 3:
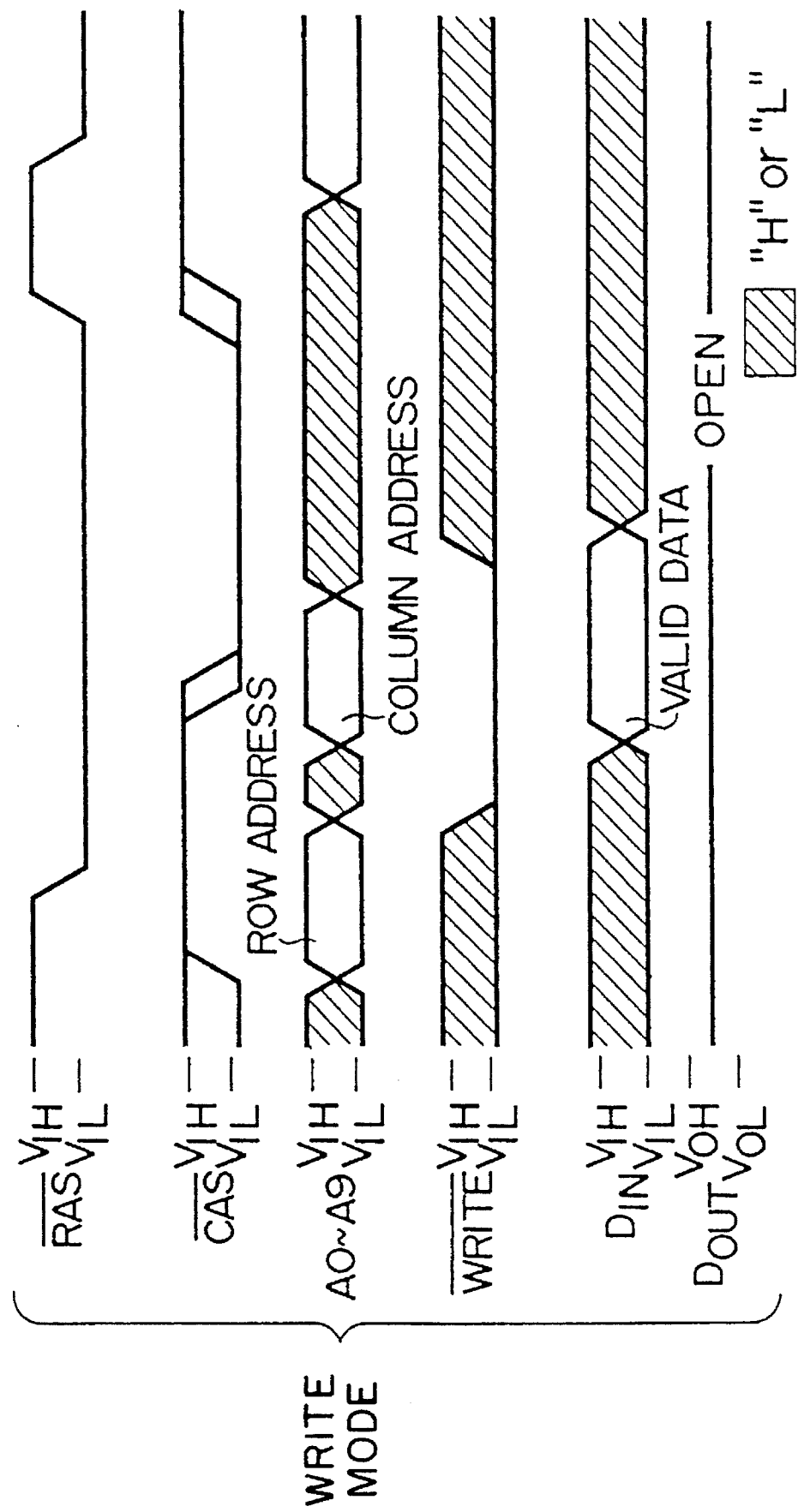
Figure 4:
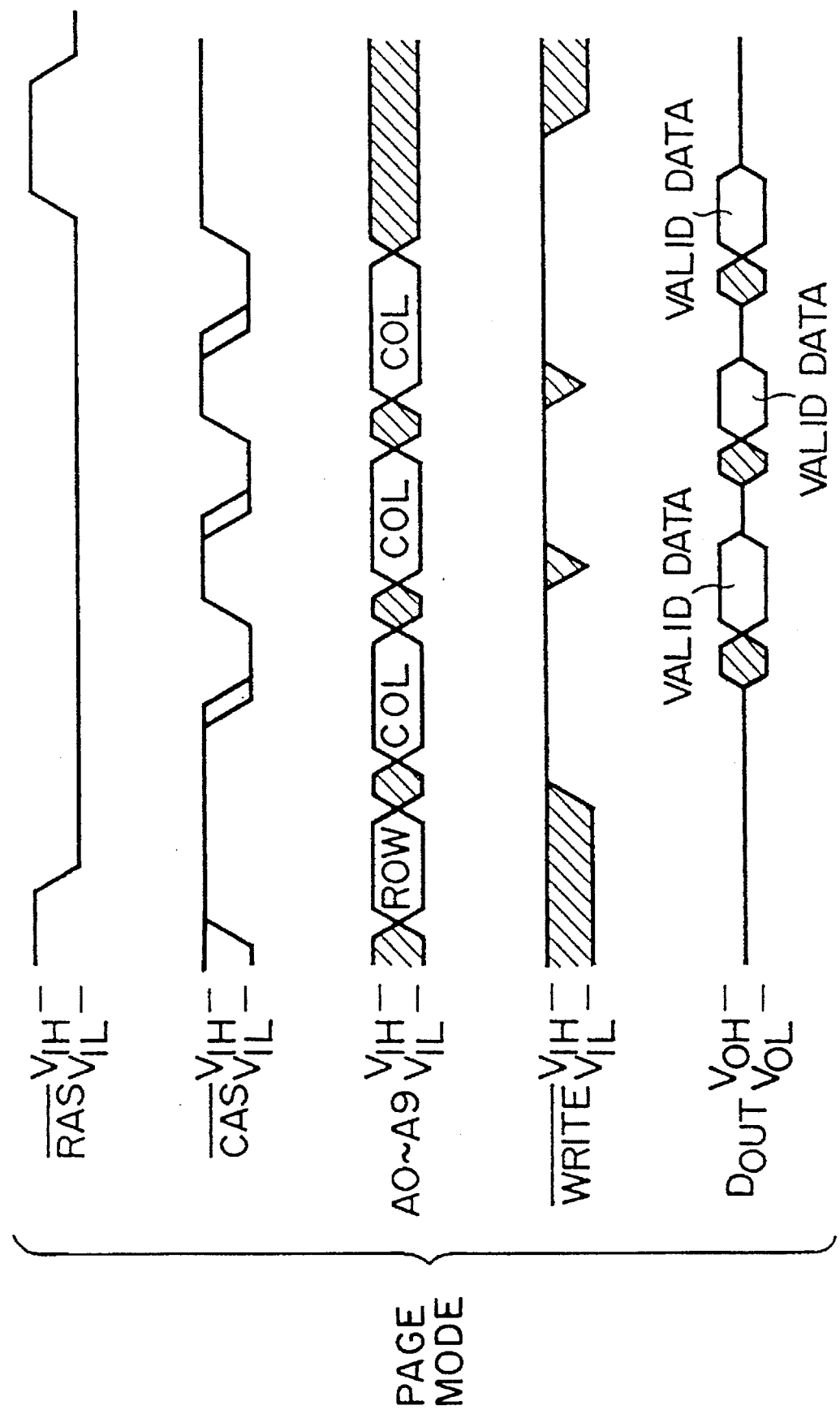
FIG. 4 is a timing chart showing an operation of a conventional semiconductor memory device in a page mode.
Figure 5:
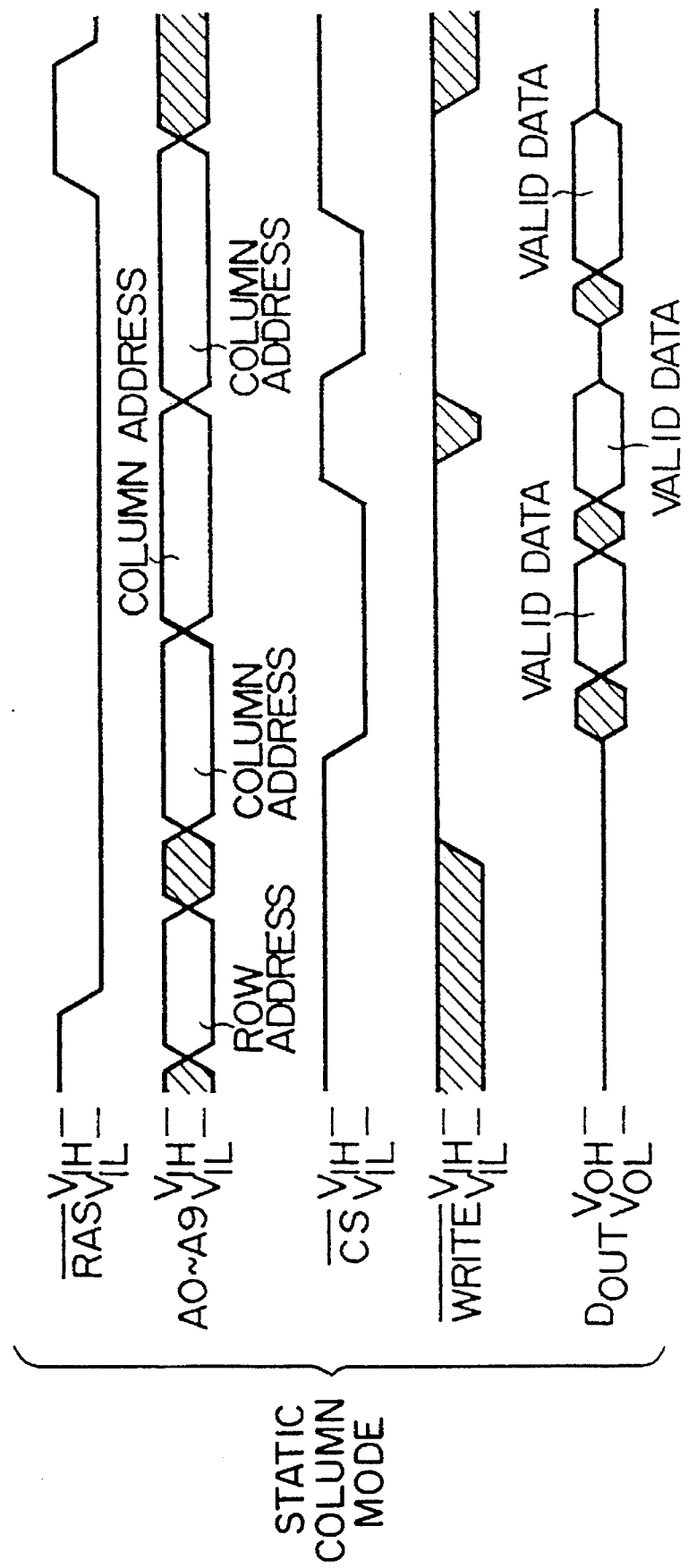
FIG. 5 is a timing chart showing an operation of a conventional semiconductor memory device in a static column mode.
Figure 6:
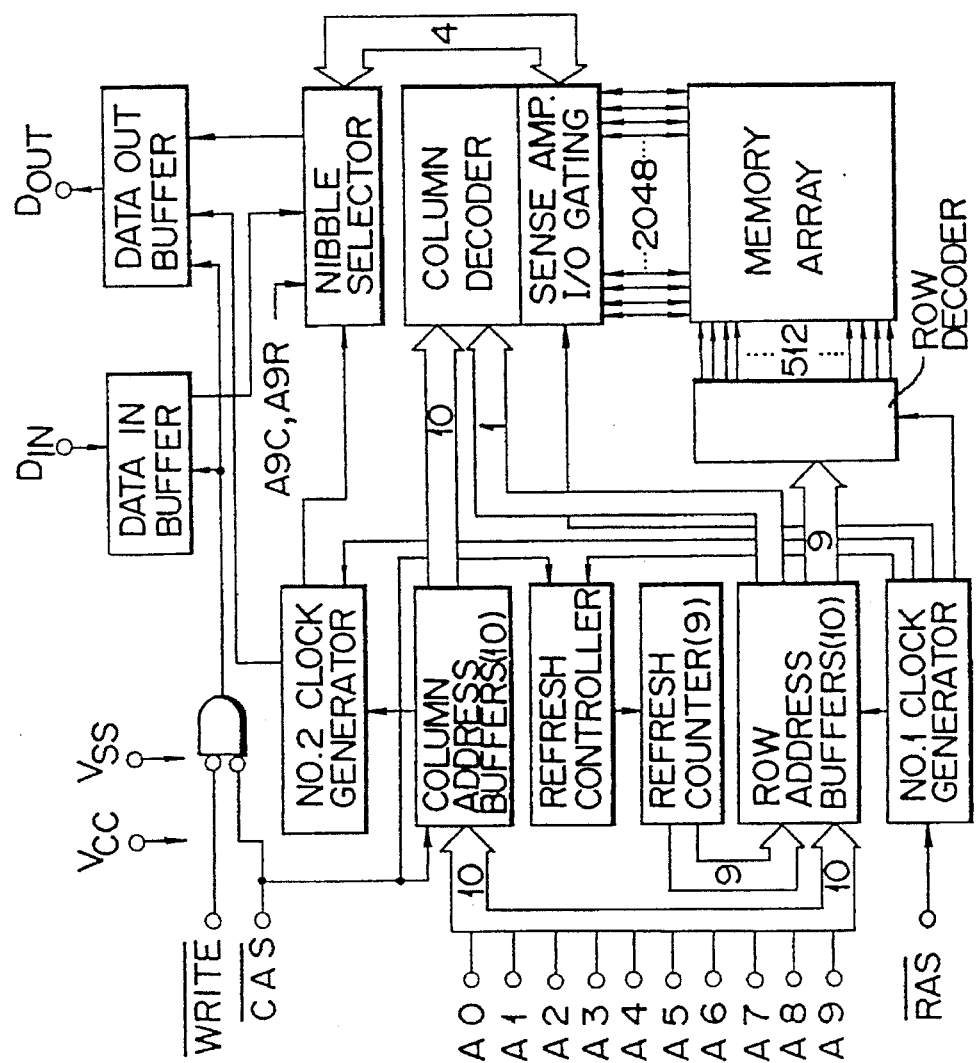
FIG. 6 is a block diagram showing the structure of a conventional semiconductor memory device in a nibble mode.
Figure 7:
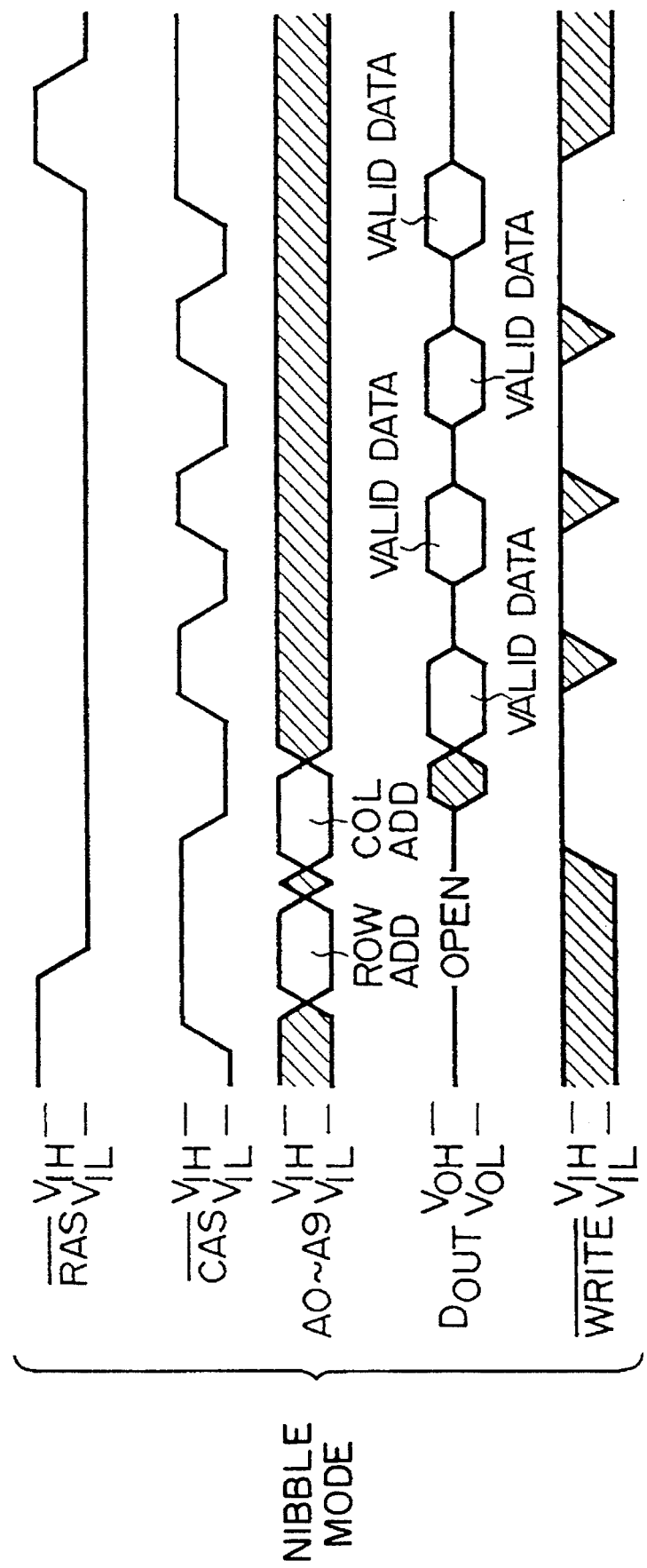
FIG. 7 is a timing chart showing an operation of the device shown in FIG. 6.

An embodiment of the present invention will now be described in detail with reference to the accompanying drawings. In the description, the same reference numerals are assigned to the common components throughout the drawings to avoid repeated explanations.

Figure 8:
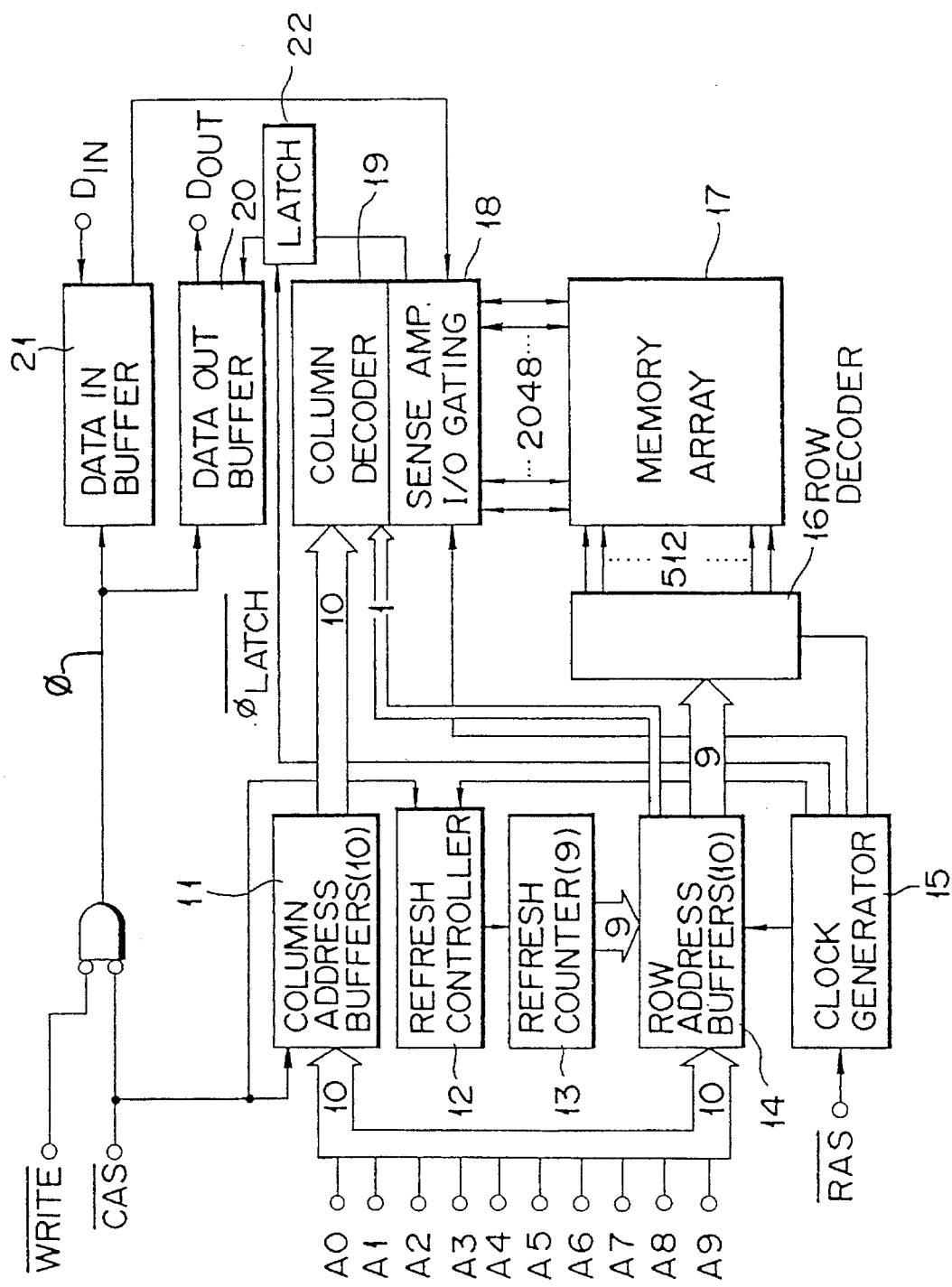
FIG. 8 is a block diagram showing the structure of a semiconductor memory device according to an embodiment of the present invention.

FIG. 8 is a block diagram showing an address multiplex type DRAM according to an embodiment of the present invention. The DRAM includes a semiconductor memory circuit constituted by column address buffers 11, refresh controller 12, refresh counter 13, row address buffers 14, clock generator 15, row decoder 16, memory array 17, sense amplifier and I/O gate 18, column decoder 19, data output buffer 20, and data input buffer 21. The DRAM also includes latch 22 for latching data output from I/O gate 18 via the sense amplifier until data output buffer 20 is in an operative state. Latch 22 is controlled by an $\overline{RAS}$ signal (latch signal $\overline{LATCH}$), and data output buffer 20 is controlled by a $\overline{CAS}$ signal. By virtue of latch 22, an operation of selecting a memory cell and latching data read therefrom and an operation of outputting the latched data can be separately performed in two cycles. More specifically, in a first $\overline{RAS}$ cycle, latch 22 latches first data read from a memory cell accessed at random, and in a second $\overline{RAS}$ cycle, latch 22 transfers the first data to data output buffer 20 and thereafter latches second data read from a memory cell accessed at random. Thus, a data reading operation requires two $\overline{RAS}$ cycles; however, with regard to one $\overline{RAS}$ cycle, a read operation from memory cell selection to data-outputting is performed in a shorter period of time than by a conventional device. As a result, a high data rate can be obtained.

Figure 9:
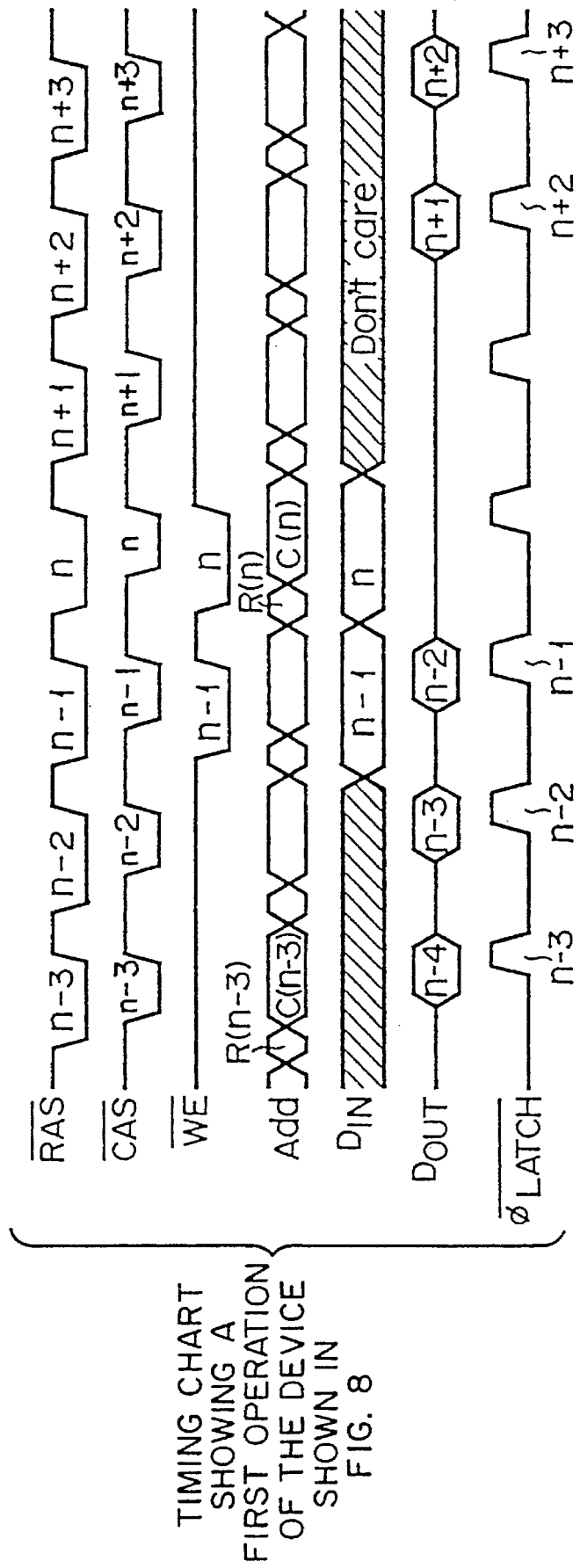
FIG. 9 is a timing chart showing a first operation of the device shown in FIG. 8.

FIG. 9 is a timing chart showing operations of the address multiplex type DRAM shown in FIG. 8. The operations will be described below with reference to FIGS. 8 and 9.

Referring to (n–3)th $\overline{RAS}$ cycle, a row address (R(n–3)) is retrieved in the memory device at a trailing edge of the $\overline{RAS}$ clock. In accordance with the address, a word line is selected and activated, thereby causing a sense amplifier to operate. At a trailing edge of the (n–3)th $\overline{CAS}$ clock, a column address (C(n–3)) is retrieved, and data of the corresponding sense amplifier is selected and read out of memory cell array 17. Further, at a trailing edge of (n–3)th $\overline{\text{CAS}}$ clock, data output buffer 20 is activated, and data $D_{OUT}$(n–4), which has been latched by latch 22 during a stand-by period of (n–4)th $\overline{\text{RAS}}$ cycle, is transferred to data output buffer 20. At the same time, read data (data $D_{OUT}$(n–3)) of (n–3)th $\overline{\text{RAS}}$ cycle read out of memory cell array 17 is latched by latch 22, after the data $D_{OUT}$(n–4) is transferred to data output buffer 20. The data $D_{OUT}$(n–3) latched by latch 22 is kept latched even after the $\overline{\text{RAS}}$ and $\overline{\text{CAS}}$ clocks rise and the memory device is in standby state.

As described above, in the reading operation, at the same time the RAM is in an operative state, data output buffer 20 is activated and outputs data $D_{OUT}$ which has been selected in the previous $\overline{\text{RAS}}$ cycle and latched in latch 22. In other words, unlike in the prior art, data output buffer 20 need not stand by until read data is transferred by the sense amplifier. Hence, access time is extremely short and can be equivalent to the conventional (single) CAS access time, that is, the one $\overline{\text{CAS}}$ cycle.

Referring to the (n–1)th $\overline{\text{RAS}}$ cycle, while read data $D_{OUT}$ of the (n–2)th $\overline{\text{RAS}}$ cycle is being read from data output buffer 20, write data $D_{IN}$ of the (n–1)th $\overline{\text{RAS}}$ is input to data input buffer 21 and written in the memory cell. In a writing operation, unlike in a reading operation, since an operation of selecting a memory cell and an operation of transferring write data to the sense amplifier can be performed in parallel, a write operation can be completed in one cycle Within a short period of time.

While a reading operation is performed after a write operation, read data is not transferred to data output buffer 20. In view of this, a control circuit may be provided so that data output buffer 20 may be kept in a stand-by state in a cycle subsequent to the write cycle.

Figure 10:
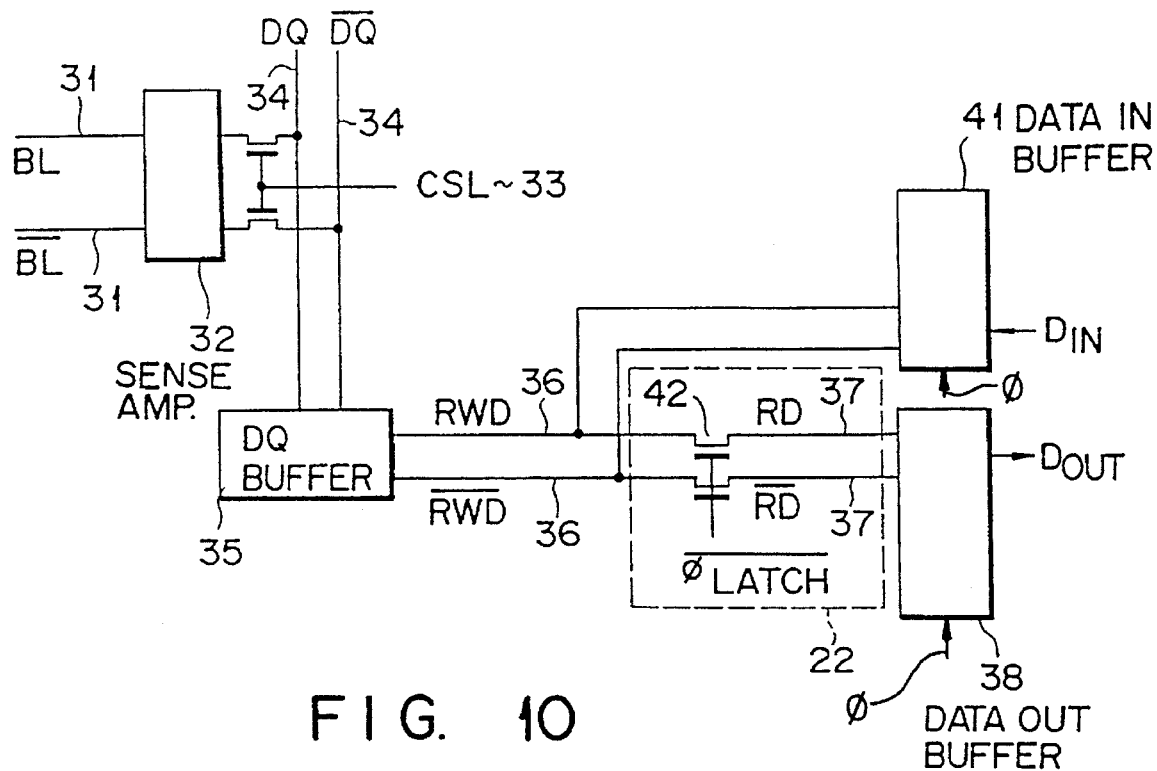
FIGS. 10 and 11 are circuit diagrams showing circuit means for latching data to be output.

FIG. 10 shows the structure of an example of latch 22 in the semiconductor memory device according to the present invention.

In the first $\overline{\text{RAS}}$ cycle, read data is read out from the selected memory cell through bit lines (BL, $\overline{\text{BL}}$) into sense amplifier 32, which is connected through input output gates activated by a column select signal via column select line (CSL) 33 to common data line pair (DQ, $\overline{\text{DQ}}$) 34, and in which the data is amplified, prior to being lead through common data line pair 34 to DQ buffer 35, from which the read data, is output to RWD lines (RWD, $\overline{\text{RWD}}$) 36. Thereafter, switch 42 is opened in response to a latch signal $\phi_{\text{LATCH}}$, and the read data is latched in RD lines (RD, $\overline{\text{RD}}$) 37. While the read data is being latched in RD lines 37, the memory device is in a standby state, until the next read or write cycle. A bistable circuit for storing data, such as a flip-flop may be connected on RD lines 37.

In the second $\overline{\text{RAS}}$ cycle subsequent to the first $\overline{\text{RAS}}$ cycle, if data output buffer 20 is activated at the same time as a trailing edge of the $\overline{\text{CAS}}$ clock, read data $D_{OUT}$ latched in RD lines 37 is transferred to data output buffer 38. In this case, if the data is transferred from RD lines 37 to data output buffer 38 dynamically via a logic circuit or the like, data output buffer 38 can hold the read data $D_{OUT}$. Hence, after the read data is transferred to data output buffer 38, it is possible to separate RD lines 37 from data output buffer 38, open switch 42 in response to the latch signal $\phi_{\text{LATCH}}$, and prepare to latch the next read data.

Figure 11:
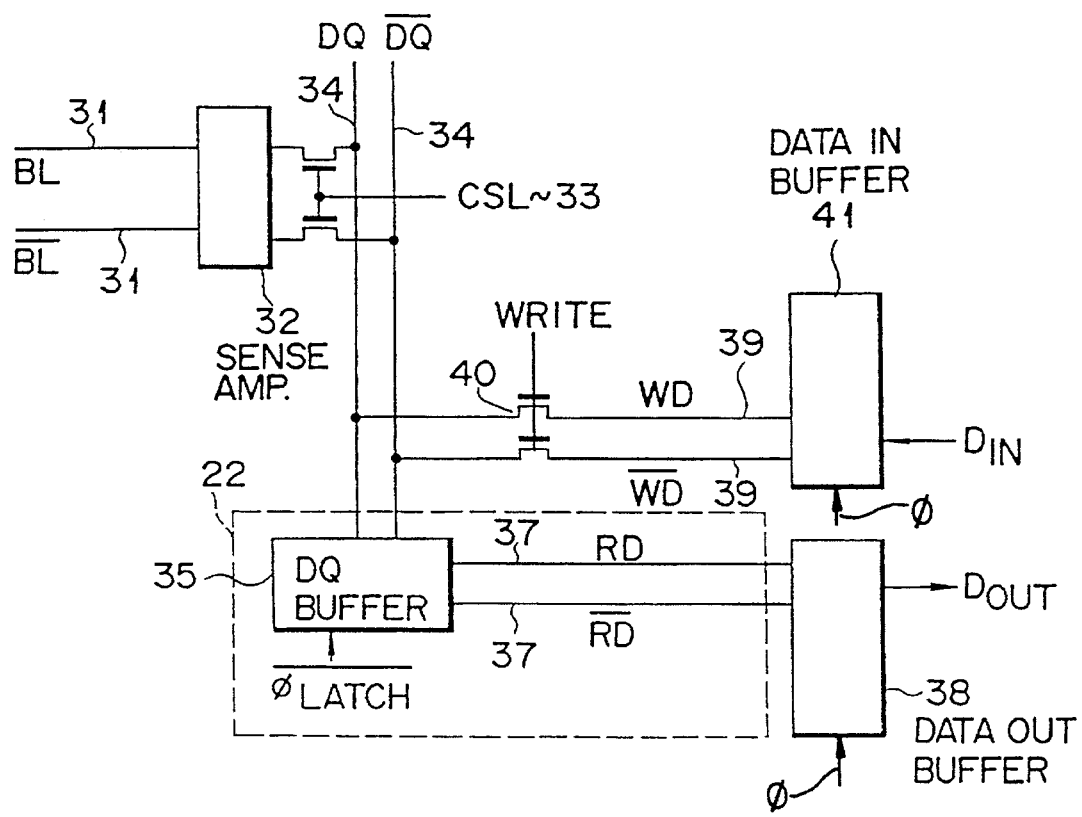

FIG. 11 shows a modification of the structure shown in FIG. 10, in which latch 22 is arranged nearer to the sense amplifier than in FIG. 10. In FIG. 11, the same elements as in FIG. 10 are identified with the same reference numerals, so that a detailed description of the common elements need not be repeated.

In this embodiment, the latch signal $\phi_{\text{LATCH}}$ is incorporated in an operation signal of DQ buffer 35, and read data is latched in RD lines 37. In this case, write data is transferred from WD lines (WD, $\overline{\text{WD}}$) 39 directly to common data line pair 34, not through DQ buffer 35. For this purpose, transfer gate 40 which is controlled by a write signal (WRITE) may be used, or a logic circuit may be formed by using the write signal and WD lines 39. In FIG. 11, the reference numeral 41 denotes a data input buffer.

In the embodiment of FIG. 11, since latch 22 is arranged near the sense amplifier, a series of reading operations can be divided into two equal parts and performed in two cycles. Hence, high reading efficiency and a high data rate are achieved.

In the aforementioned embodiment of FIGS. 8 and 9, when the operation is switched from a reading cycle to a writing cycle, both the output and input buffers are activated. Hence, it is difficult to obtain a common I/O bus arrangement. Although it is possible to form a common I/O bus by the conventional technique of delayed write (the output buffer is brought into a stand-by state after outputting read data, and then write data is input), this may result in increasing the cycle time and lowering the data rate, which is contrary to the object of the invention.

Figure 12:
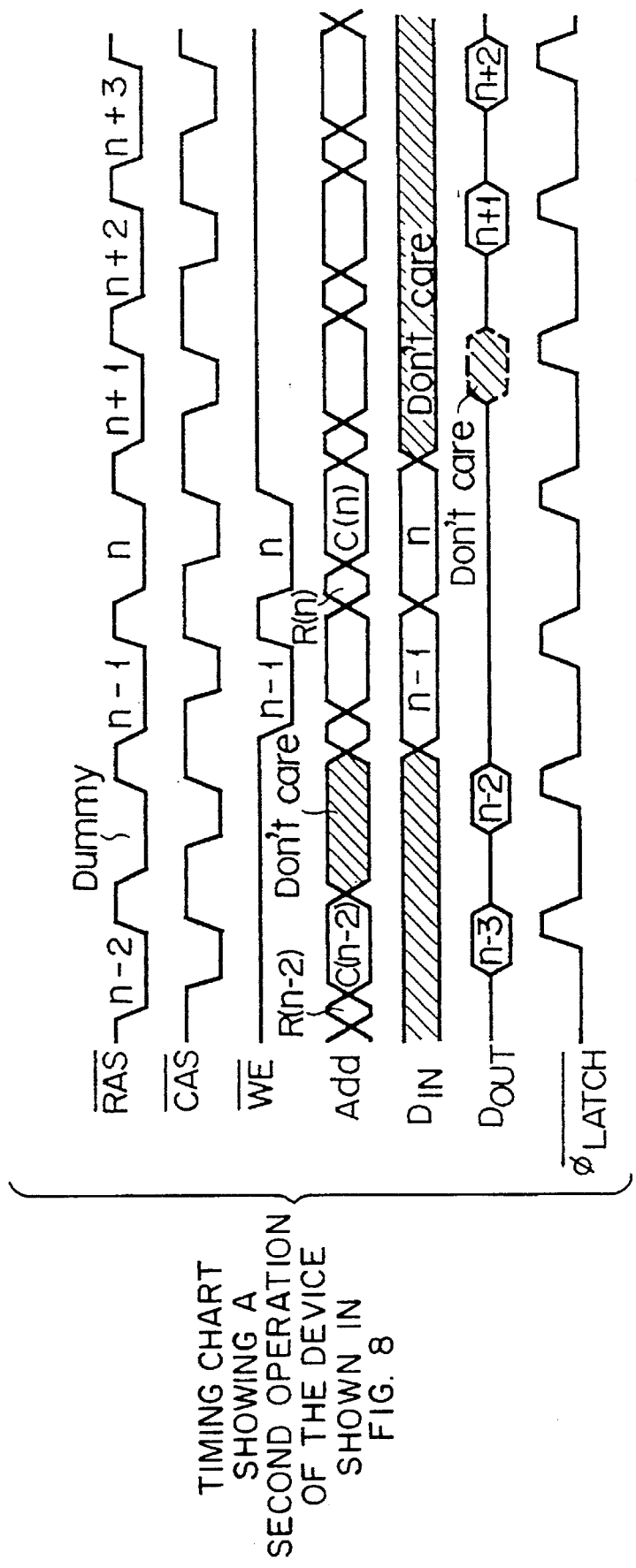
FIG. 12 is a timing chart showing a second operation of the device shown in FIG. 8.
Figure 13:
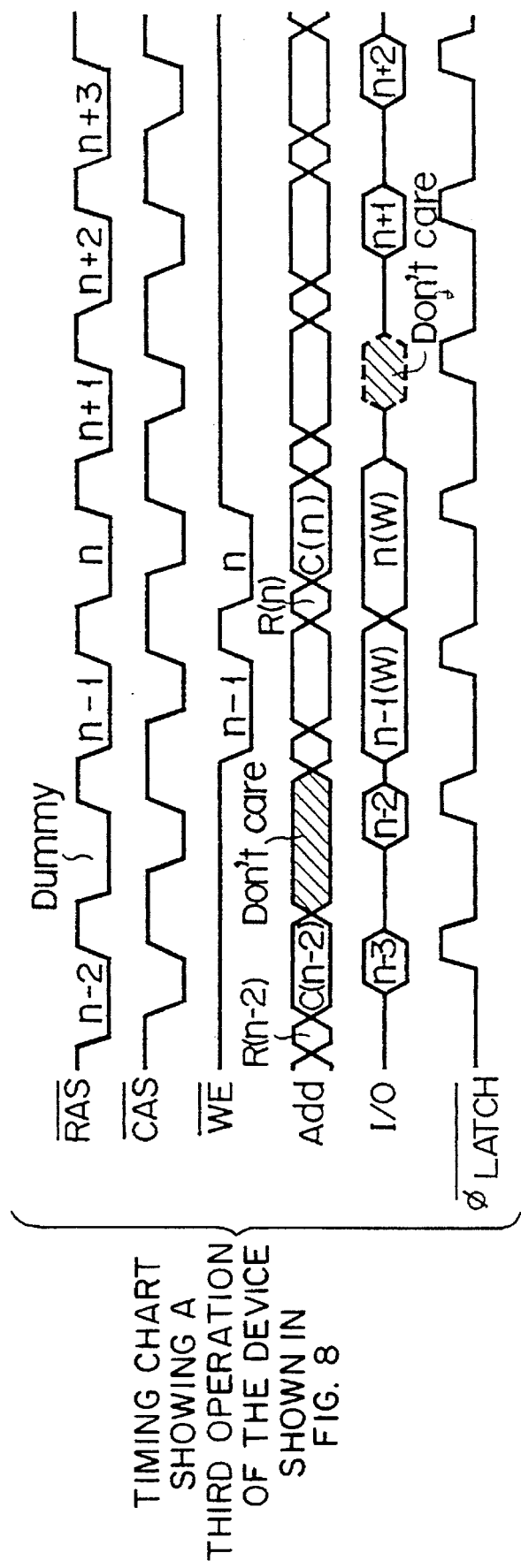
FIG. 13 is a timing chart showing a third operation of the device shown in FIG. 8.

This drawback can be overcome by operations shown in the timing charts of FIGS. 12 and 13. FIG. 12 shows an operation for obtaining a common I/O bus arrangement. FIG. 13 shows an operation for obtaining an arrangement in which the RAM itself is arranged as an I/O common (both data $D_{OUT}$ and $D_{IN}$ are input/output via an I/O pin). As shown in these timing charts, a dummy cycle is inserted between a reading cycle and a writing cycle. In a dummy cycle, read data of the previous cycle is output. In other words, read data in a first writing cycle (a writing cycle which first appears after a reading cycle) is not output and invalidated. As a result, input data and output data are prevented from colliding on the common I/O bus or the I/O pin. In the writing cycle, the output buffer is controlled so as to be in a stand-by state.

Figure 14:
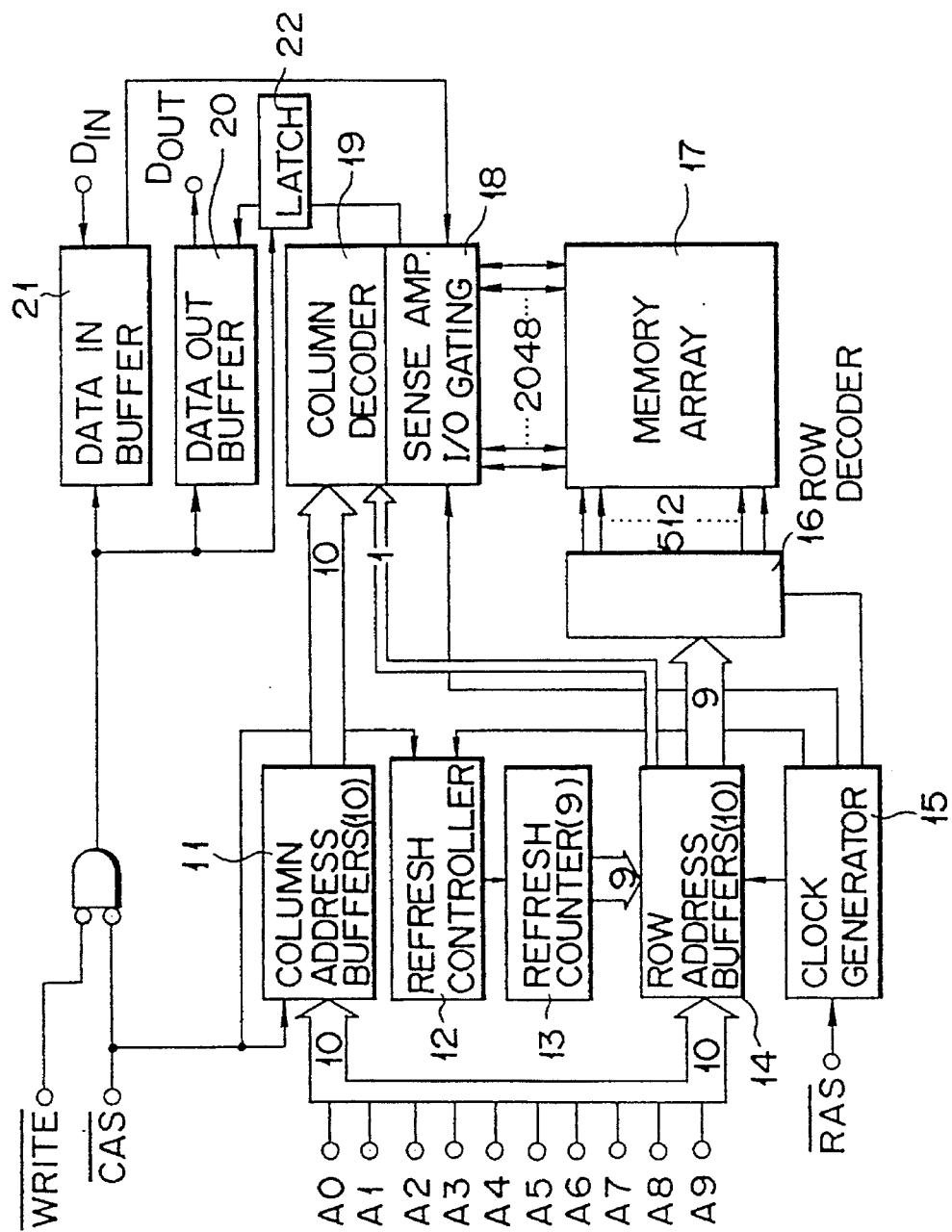
FIGS. 14 to 16 are block diagrams showing structures of the semiconductor memory device according to other embodiments of the present invention.
Figure 15:
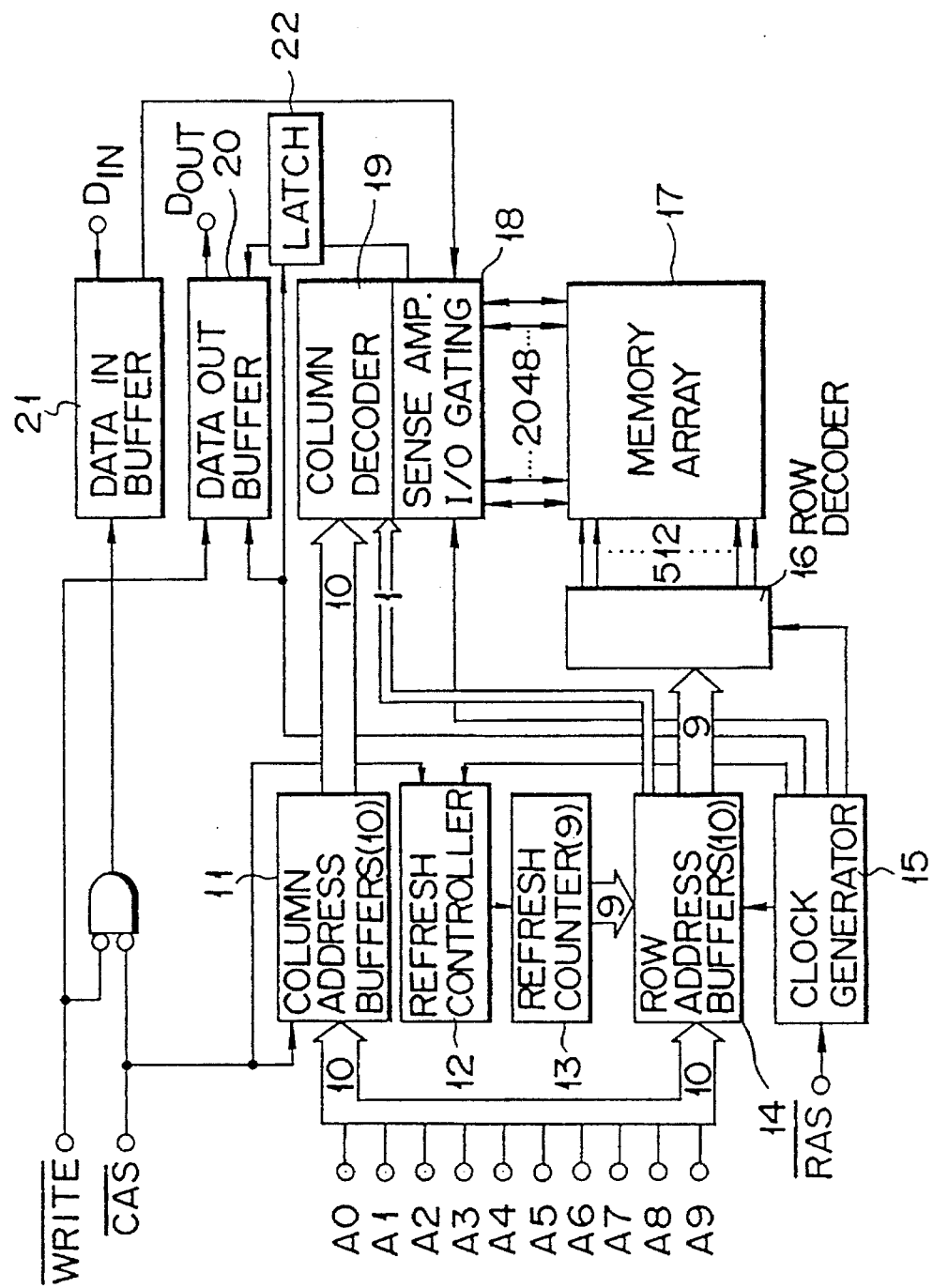
Figure 16:
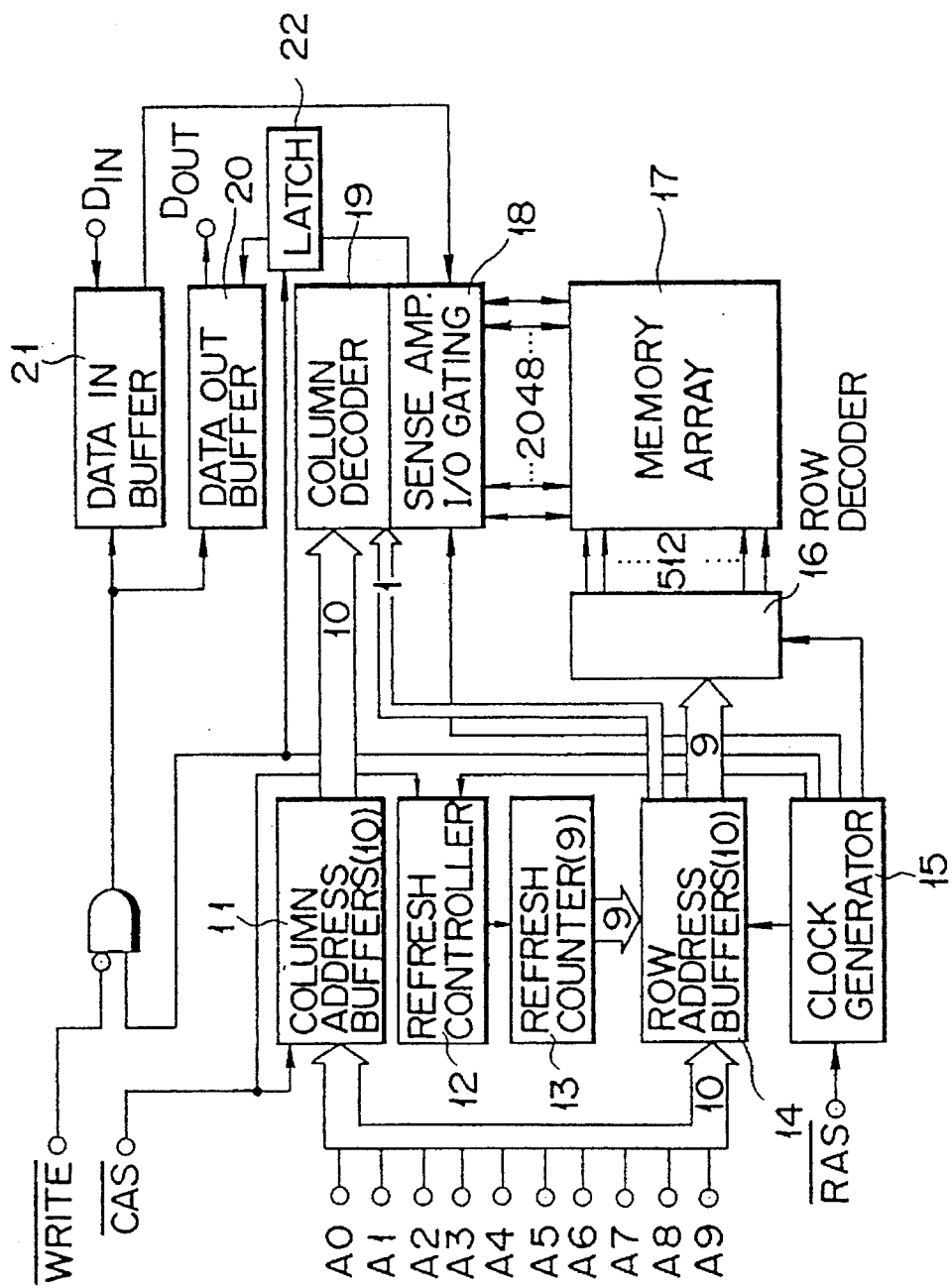

In the embodiment of FIG. 8, latch 22 is controlled by an $\overline{\text{RAS}}$ signal, and data output buffer 20 is controlled by a $\overline{\text{CAS}}$ signal. However, this invention is not limited to this embodiment, and can be modified variously. For example, as shown in FIG. 14, both latch 22 and data output buffer 20 may be controlled by $\overline{\text{CAS}}$ signals. Also, as shown in FIG. 15, both latch 22 and data output buffer 20 may be controlled by $\overline{\text{RAS}}$ signals. Moreover, as shown in FIG. 16, latch 22, data buffer 20 and data input buffer 21 may be controlled by an $\overline{\text{RAS}}$ signal.

Although an address multiplex type RAM has been described above, this invention can be applied to other types of RAMs..

In addition, although a DRAM constituted by dynamic memory cells each comprising an MOS capacitor and an MOS transistor has been described above, this invention is not limited to such a DRAM. For example, this invention can be applied to static RAMs and ROMs (read only memories), which are constituted by static memory cells each comprising two MOS transistor connected to a flip-flop, and a transfer gate connected to the drain of each MOS transistor.

As has been described above, in the semiconductor memory device according to the present invention, an operation of selecting a memory cell and an operation of outputting the latched data are performed separately in two cycles. Thus, although a data reading operation requires two cycles, selection of a memory cell and data output are performed in parallel in one cycle, resulting in a high data rate. More specifically, a data rate can be higher than that of the cycle time required for accomplishing one reading or writing operation without increasing the operation speed of the RAM. Moreover, data to be read or written can be accessed perfectly at random.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:

a memory cell array;

addressing means for receiving an address signal, a row address strobe signal, and a column address strobe for addressing said memory cell array;

an output buffer for outputting data read from said memory cell array, said output buffer being controlled by one of the row address strobe signal and the column address strobe signal; and a latch circuit including a switch and a read data (RD) line connected between said switch and said output buffer, said latch circuit latching first data read out from a first memory cell of said memory cell array in response to a latch signal during one cycle of the row address strobe signal and during one cycle of the column address strobe signal, and said latch circuit outputting the first data to said output buffer and latching second data read out from a second memory cell of said memory cell array in response to the latch signal during another cycle of the row address strobe signal and during another cycle of the column address strobe signal, a leading edge of the latch signal occurring at a time different from when a leading edge of the row address strobe signal and the column address strobe signal occur, wherein said switch comprises a MOS transistor having a gate supplied with the latch signal, and wherein the first and second data are latched in said RD line.

2. A semiconductor memory device according to claim 1, wherein said another cycle of the row address strobe signal is performed subsequent to said one cycle of the row address strobe signal, and said another cycle of the column address strobe signal is performed subsequent to said one cycle of the column address strobe signal.

3. A semiconductor memory device according to claim 1, wherein said latch circuit is controlled by said row address strobe signal, and said output buffer is controlled by said column address strobe signal.

4. A semiconductor memory device according to claim 1, wherein both said latch circuit and said output buffer are controlled by said row address strobe signal.

5. A semiconductor memory device according to claim 1, wherein both said latch circuit and said output buffer are controlled by said column address strobe signal.

6. A semiconductor memory device comprising:

a memory cell array;

addressing means for receiving an address signal, a row address strobe signal, and a column address strobe signal for addressing said memory cell array;

an input buffer for writing data into said memory cell array, said input buffer being controlled by one of the row address strobe signal and the column address strobe signal;

an output buffer for outputting data read from said memory cell array, said output buffer being controlled by one of the row address strobe signal and the column address strobe signal; and a latch circuit including a switch and a read data (RD) line connected between said switch and said output buffer, said latch circuit latching first data read out from a first memory cell of said memory cell array in response to a latch signal during one cycle of the row address strobe signal and during one cycle of the column address strobe signal, and said latch circuit outputting the first data to said output buffer in response to the latch signal during another cycle of the row address strobe signal and during another cycle of the column address strobe signal while second data is simultaneously written from said input buffer into a second memory cell of said memory cell array, a leading edge of the latch signal occurring at a time different from when a leading edge of the row address strobe signal and the column address strobe signal occur, wherein said switch comprises a MOS transistor having a gate supplied with the latch signal, and wherein the first data is latched in said RD line.

7. A semiconductor memory device according to claim 6, wherein said another cycle of the row address strobe signal is performed subsequent to said one cycle of the row address strobe signal, and said another cycle of the column address strobe signal is performed subsequent to said one cycle of the column address strobe signal.

8. A semiconductor memory device according to claim 6, wherein said latch circuit is controlled by said row address strobe signal, and said output buffer is controlled by said column address strobe signal.

9. A semiconductor memory device according to claim 6, wherein both said latch circuit and said output buffer are controlled by said row address strobe signal.

10. A semiconductor memory device according to claim 6, wherein both said latch circuit and said output buffer are controlled by said column address strobe signal.

11. A semiconductor memory device comprising:

a memory cell array;

addressing means for receiving an address signal, a row address strobe signal, and a column address strobe signal for addressing said memory cell array;

an output buffer for outputting data read from said memory cell array, said output buffer being controlled by one of the row address strobe signal and the column address strobe signal; and a latch circuit including a buffer and a read data (RD) line connected between said buffer and said output buffer, said latch circuit latching first data read out from a first memory cell of said memory cell array in response to a latch signal during one cycle of the row address strobe signal and during one cycle of the column address strobe signal, and said latch circuit outputting the first data to said output buffer and latching second data read out from a second memory cell of said memory cell array in response to the latch signal during another cycle of the row address strobe signal and during another cycle of the column address strobe signal, a leading edge of the latch signal occurring at a time different from when a leading edge of the row address strobe signal and the column address strobe signal occur, wherein said buffer is operable when the latch signal is input thereto, and wherein the first and second data are latched in said RD line.

12. A semiconductor memory device comprising:

a memory cell array;

addressing means for receiving an address signal, a row address strobe signal, and a column address strobe signal for addressing said memory cell array;

an input buffer for writing data into said memory cell array, said input buffer being controlled by one of the row address strobe signal and the column address strobe signal;

an output buffer for outputting data read from said memory cell array, said output buffer being controlled by one of the row address strobe signal and the column address strobe signal; and a latch circuit including a buffer and a read data (RD) line connected between said buffer and said output buffer, said latch circuit latching first data read out from a first memory cell of said memory cell array in response to a latch signal during one cycle of the row address strobe signal and during one cycle of the column address strobe signal, and said latch circuit outputting the first data to said output buffer in response to the latch signal during another cycle of the row address strobe signal and during another cycle of the column address strobe signal while second data is simultaneously written from said input buffer into a second memory cell of said memory cell array, a leading edge of the latch signal occurring at a time different from when a leading edge of the row address strobe signal and the column address strobe signal occur, wherein said buffer is operable when the latch signal is input thereto, and wherein the first data is latched in said RD line.

* * * * *